United States Patent [19]

Kashida et al.

[11] Patent Number: 5,470,621
[45] Date of Patent: Nov. 28, 1995

[54] FRAME-SUPPORTED PELLICLE FOR DUSTPROOF PROTECTION OF PHOTOMASK

[75] Inventors: Meguru Kashida; Toru Shirasaki; Yuichi Hamada; Yoshihiko Nagata; Sakae Kawaguchi; Yoshihiro Kubota, all of Gunma, Japan

[73] Assignee: Shin-Etsu Chemical Co., Ltd., Tokyo, Japan

[21] Appl. No.: 271,037

[22] Filed: Jul. 6, 1994

[30] Foreign Application Priority Data

Jul. 28, 1993 [JP] Japan .................................. 5-185929

[51] Int. Cl.$^6$ ...................................................... B32B 3/00
[52] U.S. Cl. ............................................... 428/14; 355/122
[58] Field of Search ............................... 428/14; 359/350; 355/122

Primary Examiner—Alexander S. Thomas
Attorney, Agent, or Firm—McAulay Fisher Nissen Goldberg & Kiel

[57] ABSTRACT

An improvement is proposed for a frame-supported pellicle for dustproof protection of a photomask, which consists of a rigid frame and a transparent plastic membrane adhesively bonded to one end surface of the frame in a slack-free fashion, used in the photolithographic patterning work for the manufacture of fine electronic parts and devices. The improvement is obtained by coating the whole surface of the pellicle frame with a coating composition by the method of electrodeposition so as to completely solve the heretofore unavoidable problem by the dust particle deposition on the pellicle membrane during transportation and handling.

5 Claims, No Drawings

FRAME-SUPPORTED PELLICLE FOR DUSTPROOF PROTECTION OF PHOTOMASK

BACKGROUND OF THE INVENTION

The present invention relates to a frame-supported pellicle for dustproof protection of a photomask used in the patterning works for the manufacture of, for example, fine electronic materials such as semiconductor devices and liquid crystal display panels. More particularly, the invention relates to a frame-supported dustproof pellicle for a photomask, which is almost completely freed from the troubles due to occurrence of dust particles from the pellicle frame per se.

As is known, the photolithographic method is well established in the patterning works for the manufacture of semiconductor devices, such as LSIs, VLSIs and the like, liquid crystal display panels and other fine electronic materials, in which a photoresist layer formed on the surface of a substrate such as a semiconductor silicon wafer is pattern-wise irradiated with ultraviolet light through a pattern-bearing transparency called a photomask followed by development to form a patterned resist layer. In view of the extremely high fineness and precision required in this patterning work, it is very important that the photomask is absolutely dust-free since, when dust particles are deposited on the photomask, the ultraviolet light passing through the photomask is necessarily scattered by the dust particles to give a great adverse influence on the quality of the reproduced pattern such as fidelity to the photomask pattern and contrast of the reproduced images.

It is therefore a usual practice that the photolithographic patterning work is conducted in a clean room under an atmosphere of air freed from any floating dust particles as completely as possible although perfect cleanness can hardly be obtained even in a clean room of the highest class. Accordingly, it is also a usual practice that deposition of dust particles on the photomask is prevented by mounting a flame-supported dustproof pellicle on the photomask. The frame-supported dustproof pellicle mentioned above is an integral device consisting of a frame having parallel end surfaces and made from a rigid material, such as an aluminum alloy, and a thin, highly transparent film of a polymeric resin, which is called a pellicle membrane, spread over and adhesively bonded to one end surface of the pellicle frame in a drumhead-like slack-free fashion. Usually, the other end surface of the pellicle frame, reverse to the end surface to which the pellicle membrane is adhesively bonded, is coated with a pressure-sensitive adhesive so as to ensure reliableness of mounting of the pellicle frame on the photomask.

When a frame-supported pellicle is mounted on the photomask, the dust particles floating in the atmospheric air and falling therefrom are never deposited directly on the photomask but are deposited on the pellicle membrane. Since the light beams used for the pattern-wise exposure to light are focused at the patterned images on the photomask, the dust particles deposited on the pellicle membrane, which is held apart above the photomask, have little adverse influences on the quality of the pattern reproduction in the photolithography.

Needless to say, all of the products of frame-supported pellicles as manufactured receive very close inspection to ensure complete absence of dust particles deposited on the pellicle membrane before they are encased in a holder case and packaged for transportation and delivery to the users.

Nevertheless, it is sometimes the case that dust particles, though very few, are found on the pellicle membrane of the frame-supported pellicle taken out of the unpacked case at the user's site. This trouble is due to nothing other than falling of dust particles held on a certain surface other than the pellicle membrane on to the pellicle membrane as a consequence of the vibrations and shocks which the encased pellicle receives during transportation on a truck, railroad car or airplane as well as in handling of the packages. A surface of possibility thought of for such a surface other than the pellicle membrane, which holds the dust particles and from which the dust particles fall on to the pellicle membrane, is the surface of the pellicle frame. In this regard, it would be worthwhile to consider the material of the pellicle frames.

While pellicle frames are made from a rigid material including metallic materials such as aluminum alloys and stainless steels and plastic resins such as polyethylenes, the most conventional material of pellicle frames is an aluminum alloy in view of the high mechanical strengths for its low weight and the surface of the pellicle frame made from an aluminum alloy is usually provided with an oxide film by anodization to increase the surface hardness and the oxide film is colored in black to prevent stray light. When the surface of the pellicle frame of an aluminum alloy is anodized and colored in black, it has been found that the thus treated surface is microscopically far from smoothness but the anodized oxide film on the surface has a porous structure with ruggedness and is hard but brittle. Accordingly, it is not surprising that dust particles are formed in or from such a rugged and brittle surface of the pellicle frame under a force received in the course of manufacture thereof or by frictionally contacting with the inner surface of the holder case due to unavoidable vibrations and shocks during transportation and handling. For example, it would not be an impossible case that dust particles and particles of the black pigment enclosed in the pores of the porous oxide film on the frame surface are released and scattered into the space to be deposited on the pellicle membrane. The brittle surface layer on the pellicle frame would readily be broken into dust particles when the surface is contacted with the inner surface of the holder case under vibrations and shocks.

A proposal has been made in Japanese Patent Publication 63-777 and Japanese Patent Kokai 64-48062, according to which the inwardly facing surface of a pellicle frame is coated with a pressure-sensitive adhesive or with a sticky coating composition. This method is indeed not ineffective because any dust particles floating within the space surrounded by the frame-supported pellicle and the photomask, when the pellicle is mounted on the photomask, can be captured by hitting at the sticky surface. This method, however, cannot provide a solution for the above described problems in the prior art.

SUMMARY OF THE INVENTION

The present invention accordingly has an object to provide a novel and improved frame-supported pellicle for dustproof protection of a photomask used in the photolithographic patterning works for the manufacture of electronic devices, which is free from the above described problems and disadvantages in the prior art pellicles due to occurrence of dust particles from the surface of the pellicle frame.

Thus, the frame-supported pellicle provided by the present invention is an integral body which comprises:

(a) a frame made from a rigid material, which is preferably an aluminum alloy, and provided on the whole surface with a layer of a coating composition formed by the coating method of electrodeposition in an aqueous coating composition; and (b) a transparent film of a plastic resin spread over and adhesively bonded to one of the end surfaces of the frame in a drumhead-like slack-free fashion.

DETAILED DESCRIPTION OF THE PREFERRED EMBODIMENTS

As is described above, the frame-supported pellicle of the present invention is an integral body consisting of a rigid frame and a thin, transparent plastic resin film as the pellicle membrane spread over and adhesively bonded to one of the end surfaces of the pellicle frame in a drumhead-like slack-free fashion. Characteristically and differently from the pellicle frames in conventional frame-supported pellicles, the frame is provided on the whole surface, not a part of the surface, with a coating layer of a coating composition and this coating layer of a coating composition is formed by the coating method of electrodeposition.

Since the coating layer on the pellicle frame is formed over the whole surface of the pellicle frame, the trouble due to occurrence of dust particles from the porous surface of the pellicle frame during transportation and handling can be completely prevented. Further, it is essential in the invention that the coating layer on the frame surface is formed by the coating method of electrodeposition. This unique coating method is particularly advantageous because the coating layer formed by this method is free from the problems due to non-uniformity of the coating layer and unacceptable appearance of the coated pellicle frames otherwise unavoidable more or less. In addition, the adhesion between the coating layer and the substrate surface is very firm and reliable as compared with coating layers formed by other coating methods because deposition of the coating composition takes place not only on the macroscopically flat surface of the frame but also on the surface within the microscopic pores even when the pellicle frame has a porous surface layer thus to prevent eventual failing of any particulate materials, such as pigment particles, contained in the coating layer.

The material forming the pellicle frame of the inventive frame-supported pellicle is not particularly limitative provided that the frame made therefrom has rigidity including metallic materials such as stainless steels and aluminum alloys and plastic resins such as polyethylenes. Preferably, however, the material of the frame is an aluminum alloy such as various grades of duralumins in respect of the high mechanical strength for the lightness in weight. The surface of the frame made from an aluminum alloy can be anodized to be imparted with increased corrosion resistance and increased hardness of the frame surface.

It is essential that the pellicle frame is coated on the whole surface thereof with a coating composition by the method of electrodeposition, which is performed by immersing the pellicle frame as the substrate in a bath of an aqueous solution or aqueous emulsion of a hydrophilic coating composition and by applying a directcurrent voltage between the pellicle frame and a counterelectrode of a metal or carbon so as to deposit the coating composition on to the surface of the pellicle frame. Depending on the ionicity of the coating composition, the electrodeposition can be classified into the anionic electrodeposition, in which the pellicle frame is the anode and the counterelectrode is the cathode, and the cationic electrodeposition, in which the polarity between the pellicle frame and the counterelectrode is reversed. It is preferable in the invention that the electrodeposition is of the cationic type because no metal ions are released into the aqueous coating bath.

The procedure of electrodeposition is performed at a bath temperature of 10° to 50° C. or, preferably, 20° to 30° C. and applying a direct-current voltage of 20 to 200 volts or, preferably, 80 to 150 volts. The length of time for the electrodeposition is usually from 1 to 10 minutes such that the coating layer to be obtained has a thickness in the range from 5 to 50 μm or, preferably, from 15 to 30 μm. When the thickness of the coating layer is too small, no full smoothing effect can be obtained on the frame surface having ruggedness while, when the thickness of the coating layer is too large, the productivity of the process is decreased due to the unduly long time taken for a single run of the electrodeposition along with an increased risk of the trouble due to eventual falling of the thick coating layer from the frame surface.

The vehicle resin in the coating composition used in the electrodeposition should be water-soluble or hydrophilic in order to form an aqueous coating bath. Though not particularly limitative, it is desirable that the resin of the coating composition has good resistance against ultraviolet irradiation since pellicles are used in the photolithographic process using ultraviolet light in addition to the requirement for mechanical strengths. In this regard, examples of preferred vehicle resins in the coating composition for electrodeposition include acrylic resins and fluorocarbon resins. The solid content of the bath for coating by electrodeposition is in the range from 1 to 50% by weight or, preferably, from 5 to 20%. Since it is desirable that the coating layer formed by the electrodeposition is colored in black in order to minimize the troubles due to stray light, the coating composition is preferably admixed with a black dye or pigment so that the coating layer as formed is already colored in black. The amount of the black coloring agent in the coating composition is 0.1 to 1.0% by weight based on the solid matter in the electrodeposition bath.

The pellicle frame coated and colored in the above described manner is then provided with a pellicle membrane which is spread over and adhesively bonded to one of the end surfaces of the pellicle frame by using an adhesive in a drumhead-like slack-free fashion. The method for this adhesive bonding can be conventional. The material of the pellicle membrane is also not particularly limitative including nitrocellulose, cellulose acetate, pullulan, polymer of trimethyl vinyl silane, amorphous fluorocarbon polymer, silicone-modified polyvinyl alcohol and the like.

In the following, the frame-supported pellicle of the present invention is illustrated in more detail by way of examples and comparative examples.

EXAMPLE 1.

Square flames each having an outer side length of 100 mm, height of 6 mm and frame width of 2 mm were prepared from A1-7075 duralumin and coated with a poly(methyl methacrylate) re by electrodeposition.

Thus, 20 liters of an aqueous emulsion containing 10% by weight of a poly(methyl methacrylate) resin as the dispersed phase with admixture of carbon black in an amount of 0.5% by weight based on the resin were introduced into an electrolytic tank of 25 liters capacity as the electrodeposition bath and kept at a temperature of 25 ° C. The duralumin flames prepared above as the cathode and stainless steel plates as the anode were immersed in the bath and electrodeposition was performed for 10 minutes by applying a direct-current voltage of 120 volts between the cathode and anode to form a black coating layer having a thickness of 15μm on the frame surface.

A film of nitrocellulose having a thickness of 0.87μm was adhesively bonded to one end surface of the above prepared pellicle frame in a slack-free fashion by using an epoxy resin-based adhesive in a conventional manner as the pellicle membrane followed by trimming. The other end surface of the pellicle frame was coated with a polybutene-based pressure-sensitive adhesive in a coating thickness of 0.5 mm and the adhesive surface was temporarily protected by attaching a removable sheet coated with a siliconebased releasing agent.

After confirmation of absolute absence of any dust particles having a diameter of 0.3μm or larger on the pellicle membrane by microscopic visual inspection, the thus completed flame-supported pellicle was encased in a holder case of polyethylene and packaged for transportation in a usual manner. A transportation test was undertaken for the encased and packaged pellicles on a truck over a distance of 1500 kilometers through a highway. The pellicles taken out of the unpackaged holder case after the transportation test were visually inspected for dust particles of 0.3/μm or larger on the pellicle membrane to detect none.

COMPARATIVE EXAMPLE 1.

The experimental procedure was substantially the same as in Example 1 described above excepting omission of the electrodeposition coating of the whole surface of the pellicle frame and, instead, coating of the inwardly facing surfaces alone of the pellicle frame with an acrylic resin-based sticking agent. The microscopic visual test undertaken after the transportation test indicated that 12 dust particles on an average were detected on each of the pellicle membranes.

EXAMPLE 2.

The experimental procedure was substantially the same as in Example 1 described above except that the vehicle resin in the coating composition for electrodeposition was not the poly(methyl methacrylate) resin but a fluorocarbon resin having a chemical structure represented by the formula:

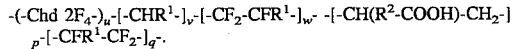

in which $R^1$ is a monovalent aliphatic hydrocarbon group unsubstituted or substituted by fluorine atoms, $R^2$ is a divalent aliphatic hydrocarbon group unsubstituted or substituted by fluorine atoms and the subscripts u, v, w, p and q are each a positive integer.

The result of the transportation test undertaken in the same manner as in Example 1 was that no dust particles could be detected on the pellicle membranes.

COMPARATIVE EXAMPLE 2.

The experimental procedure was substantially the same as in Example i described above except that the surface of the duralumin frames was subjected to an anodization treatment and, instead of the electrodeposition coating of the whole surface of the pellicle frame, the inwardly facing surfaces alone of the pellicle frames were coated with an acrylic resin-based sticking agent. The microscopic visual test undertaken after the transportation test indicated that 8 dust particles on an average were detected on each of the pellicle membranes.

What is claimed is:

1. A frame-supported pellicle for dustproof protection of photomask which is an integral body comprising:
   (a) a frame made from a rigid material and provided on the whole surface with a layer of a coating composition formed by the coating method of electrodeposition in an aqueous coating composition; and
   (b) a transparent film of a plastic resin spread over and adhesively bonded to one of the end surfaces of the frame in a drumhead-like slack-free fashion.

2. The frame-supported pellicle as claimed in claim 1 in which the rigid material forming the frame is an aluminum alloy.

3. The frame-supported pellicle as claimed in claim 1 in which the layer of a coating composition on the whole surface of the frame has a thickness in the range from 5 to 50μm.

4. The frame-supported pellicle as claimed in claim 1 in which the aqueous coating composition contains a vehicle resin which is an acrylic resin or a fluorocarbon resin.

5. The frame-supported pellicle as claimed in claim 1 in which the layer of a coating composition on the whole surface of the frame is colored in black by the coating method of electrodeposition in an aqueous coating composition containing a black dye or pigment.

* * * * *